(12) United States Patent
Vosters et al.

(10) Patent No.: US 6,995,379 B2
(45) Date of Patent: Feb. 7, 2006

(54) LITHOGRAPHIC APPARATUS, DEVICE MANUFACTURING METHOD, AND DEVICE MANUFACTURED THEREBY

(75) Inventors: Petrus Matthijs Henricus Vosters, Bladel (NL); Hernes Jacobs, Eindhoven (NL); Mark Van Heumen, Zwijndrecht (NL); Nicolaas Rudolf Kemper, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 22 days.

(21) Appl. No.: 10/458,726

(22) Filed: Jun. 11, 2003

(65) Prior Publication Data

US 2004/0031932 A1    Feb. 19, 2004

(30) Foreign Application Priority Data

Jun. 13, 2002  (EP) .................................. 02077355
May 16, 2003  (EP) .................................. 03253057

(51) Int. Cl.
    *A61N 5/00*     (2006.01)
(52) U.S. Cl. ............................ 250/440.11; 250/441.11; 250/442.11
(58) Field of Classification Search ............. 250/491.1, 250/492.2, 440.11–442.11
    See application file for complete search history.

(56) References Cited

U.S. PATENT DOCUMENTS

| 5,040,431 | A | | 8/1991 | Sakino et al. |
| 5,508,518 | A | * | 4/1996 | Kendall ................... 250/492.2 |
| 6,086,457 | A | | 7/2000 | Perlov et al. |
| 2001/0004105 | A1 | * | 6/2001 | Kwan et al. ............. 250/492.2 |

FOREIGN PATENT DOCUMENTS

| EP | 0 951 054 A1 | 10/1999 |
| EP | 1 107 067 A2 | 6/2001 |
| EP | 1 111 469 A2 | 6/2001 |
| EP | 1 111 471 A2 | 6/2001 |
| JP | 59-77912 | 5/1984 |
| JP | 60-55570 | 3/1985 |

\* cited by examiner

*Primary Examiner*—John R. Lee
*Assistant Examiner*—David A. Vanore
(74) *Attorney, Agent, or Firm*—Pillsbury Winthrop Shaw Pittman, LLP

(57) ABSTRACT

A lithographic projection apparatus in which a vacuum chamber provided with a vacuum generator constructed and arranged to generate a vacuum beam path for the projection beam, wherein the apparatus is provided with a collision protection apparatus for reducing the effects of a collision of an object table with the wall of the vacuum chamber or with another object table. These collisions may occur during a power failure or an error in a programmed control logic in a controller of the apparatus.

19 Claims, 7 Drawing Sheets

LITHOGRAPHIC APPARATUS, DEVICE MANUFACTURING METHOD, AND DEVICE MANUFACTURED THEREBY

RELATED APPLICATIONS

This application claims priority to European Application 02077355.2, filed Jun. 13, 2002, and 03253057.8, filed May 6, 2003, the contents of which are incorporated herein by reference.

BACKGROUND OF THE INVENTION

1. Field of the Invention

The present invention relates to collision prevention in a lithographic projection apparatus, more particularly, to a reduced sensitivity for the effects of any collision in a lithographic projection apparatus. The present invention also relates to a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. The required matrix addressing can be performed using suitable electronics.

Another example of a patterning device is a programmable LCD array. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a basic on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used it parallel or preparatory steps may be carried out on one or more tables while one or more other tables are being used for exposures.

In a lithographic apparatus, the size of features that can be imaged onto the substrate is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or examiner lasers, it has been proposed to use shorter wavelength radiation of around 13 nm. Such radiation is termed extreme ultraviolet (EUV) or soft x-ray, and possible sources include laser produced plasma sources, discharge plasma sources or synchrotron radiation from electron storage rings. Other proposed radiation types include electron beams and ion beams. These types of beam share with EUV the requirement that the beam path, including the mask, substrate and optical components, be kept in a high vacuum to prevent absorption and/or scattering of the beam, whereby a total pressure of less than about $10^{-6}$ millibar is typically necessary for such charged particle beams. Otherwise, for apparatus using EUV radiation, the total vacuum pressure need only be between $10^{-3}$ and $10^{-5}$ millibar. Optical elements for EUV radiation can be spoiled, by the deposition of carbon layers on their surface, which imposes the additional requirement that hydrocarbon partial pressures should generally be kept as low as possible, for example below $10^{-8}$ or $10^{-9}$ millibar.

Working in a high vacuum imposes quite onerous conditions on the components that must be put into the vacuum. For components inside the vacuum chamber, materials that minimize or eliminate contaminant and total outgassing, i.e. both outgassing from the materials themselves and from gases adsorbed on their surfaces, should be used.

During the manufacturing process the movement of the tables, and the mask or substrate mounted on it, may be controlled with as many as six degrees of freedom (translation along three mutually orthogonal axes and rotation about those axes). Movements can occur at high velocity. At high velocity the kinetic energy of the table is high and a collision is likely to cause damage to delicate and expensive parts of the apparatus. Collisions may occur in several circumstances, for example horizontally with the walls of the apparatus defining the area the table can move in; horizontally with other tables in a multiple stage device (these have two or more tables operating in the same area); or vertically with the parts of the imaging system, for example the lens.

SUMMARY OF THE INVENTION

It is an aspect of the present invention to provide a lithographic apparatus with a reduced sensitivity for the effects of a collision of an object table with another object table or internal parts of the apparatus. It is further an object of the present invention to reduce the damage caused by such a collision.

These objects are achieved according to the invention by a lithographic apparatus including a radiation system constructed and arranged to provide a beam of radiation; a first object table constructed and arranged to support a patterning device, the patterning device constructed and arranged to pattern the beam of radiation according to a desired pattern; a second object table constructed and arranged to hold a substrate; and a projection system constructed and arranged to project the patterned beam onto a target portion of the substrate. Such an apparatus comprises a radiation system constructed and arranged to provide a beam of radiation and a first object table constructed and arranged to support the patterning device. The patterning device serves to pattern the beam of radiation according to a desired pattern. The apparatus further comprises a second object table constructed and arranged to hold a substrate and a projection system constructed and arranged to project the patterned beam onto a target portion of the substrate, and a collision protection apparatus constructed and arranged to protect at least one object table, or other internal parts, against damage from a collision.

The provision of a collision protection apparatus allows any damage to parts involved in a collision within the lithographic apparatus to be minimized or reduced to zero. In the event of a collision no expensive repair costs are incurred and the lithographic apparatus can return to production with very little lost production time.

According to a preferred embodiment of the invention the collision protection apparatus includes a bumper constructed and arranged to absorb energy of a possible collision of at least one of the object tables. Such a bumper may reduce the effects of a possible collision between the at least one object table and, for example, the wall of a vacuum chamber, in case the lithographic apparatus uses extreme ultraviolet light (EUV), or any parts of the apparatus located within the vacuum chamber.

According to another embodiment of the present invention, the bumper includes a super-elastic or memory alloy to absorb any of the collision energy. In particular the alloy is a nickel titanium alloy. Such alloys, and in particular a nickel-titanium alloy (Nitinol), have a relatively high damping coefficient without being deformed. Furthermore, such materials are up to 14 times lighter than conventional dampers, they do not require any oil and can be relatively simply employed. When the bumper is to be used in vacuum, it should be specially made for use in vacuum so that outgassing of the material the bumper is made of is limited.

According to still another embodiment of the present invention the bumper is provided to at least one of the object tables, so that the bumper may also reduce the effects of a collision between two object tables. However, the bumper may be connected with one or both of the object tables or may be positioned along the wall of a vacuum chamber, again in case the lithographic apparatus comprises a vacuum chamber.

According to a still further embodiment of the present invention the apparatus may further include a rim that is provided on at least one of the object tables, the rim projecting beyond at least one edge of the at least one object table and being connected to the at least one object table by at least one damper for relative movement thereto. In the event of a collision occurring on the edge with the protruding rim, the rim moves relative to the table while the damper limits the force transmitted to the table. The table is therefore protected from damage when a collision occurs. The at least one damper may be passive or active and may operate by, for example, viscous forces in an oil damper, eddy currents due to electromagnetic effects or friction. Alternatively, the at least one damper may deform by elastic or plastic deformation. If the damper is of a resilient type, for example a shape-memory metal exhibiting super-elastic properties, the rim will return to its previous position after impact. The lithographic apparatus can then return to production with minimal delay.

According to another embodiment of the present invention, the collision protection apparatus may further comprise a rim that is provided on at least one of the object tables, the rim projecting beyond the edges of the at least one table in a plane parallel to a direction of movement of the at least one table, two dampers connecting a first side of the rim to a first side of the at least one table, and two connecting rods connecting a second side of the rim, adjacent to the first side, to the at least one table, the connecting rods forming two opposite sides of a parallelogram in the plane parallel to the direction of movement. In this case, if an off-center collision force is applied to the first side of the table (or the side opposite), the parallelogram configuration of the connecting rods constrains the rim to move in a single direction. There is no tendency for the rim to rotate and the force is spread evenly between the two dampers.

According to another embodiment of the present invention, the collision protection apparatus may further include a rim that is provided on at least one of the object tables, the rim projecting beyond the edges of the at least one table in a plane parallel to a direction of movement of the at least one table, and a at least one first and second damper connecting each side of the rim to the at least one table. This configuration allows the at least one first and second damper to be active when an impact occurs on the crash protection rim. The dampers on adjacent sides of the rim act to ensure that the force of an off-center crash is evenly distributed between the dampers which are active.

Preferably the respective first damper is connected between a first point on the rim and a second point on the table, and the respective second damper is connected between the first point on the rim and a third point on the table, wherein the first, second and third points form a triangle in the plane horizontal to the direction of movement. This configuration also allows an off-center impact to be spread evenly among the active dampers. It also enables a compact construction.

According to a second aspect of the present invention there is provided a device manufacturing method using a lithographic apparatus, the method including projecting a patterned beam of radiation onto a target portion of the layer of radiation-sensitive material at least partially covering a substrate that is supported by a movable object table, wherein during the projecting of the beam of radiation the range of movement of the object table is limited by a collision protection apparatus that protects the object table during a collision of the object table.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

The above and further aspects, characteristics and advantages of the present invention will be explained in more detail with reference to the following description of preferred embodiments of a device and a device manufacturing method according to the invention and with reference to the drawing, in which identical reference numerals denote identical or similar components and in which.

DETAILED DESCRIPTION

Figure 1:
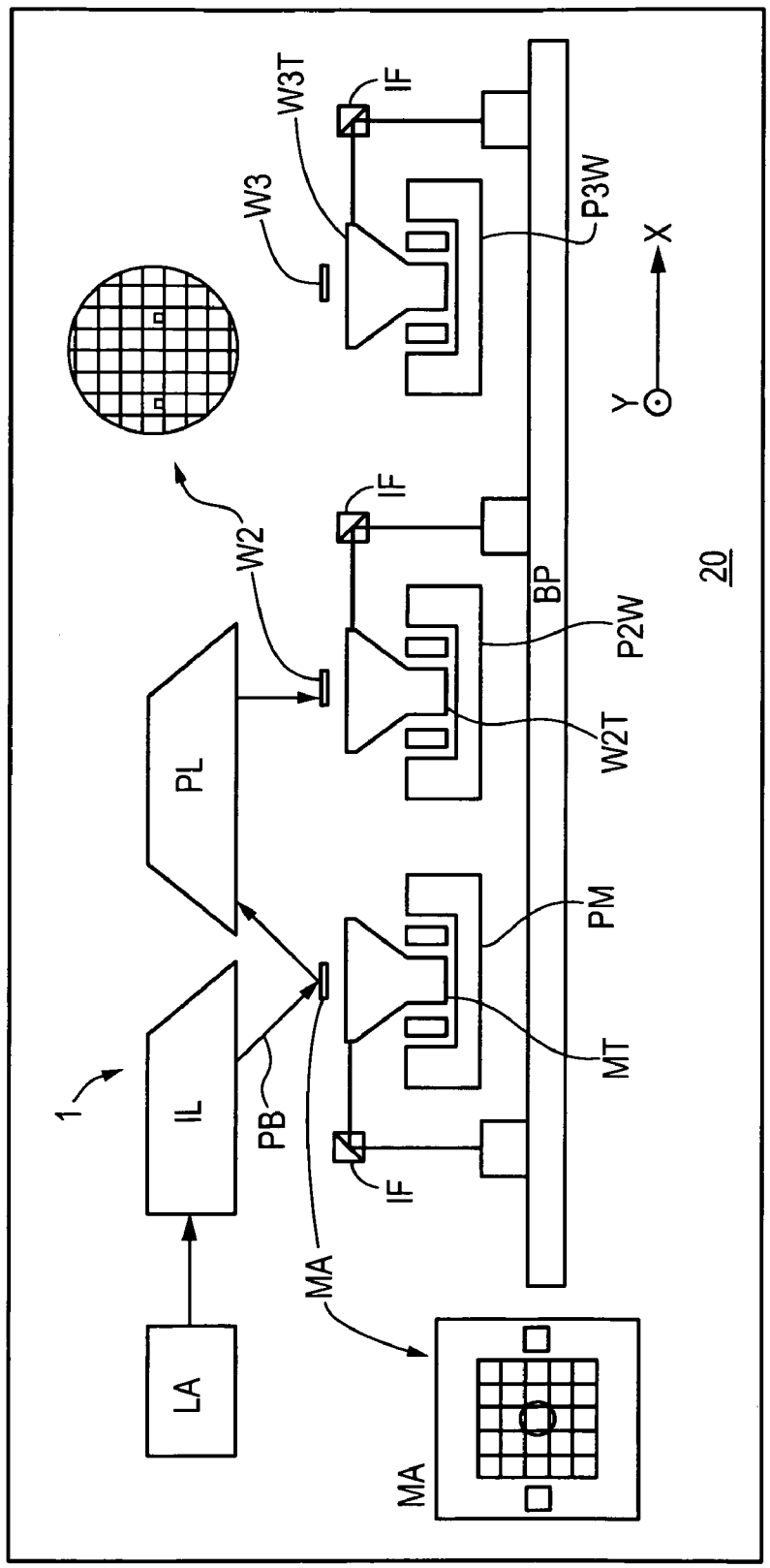
FIG. 1 depicts a lithographic projection apparatus according to a first embodiment of the present invention.

FIG. 1 schematically depicts a lithographic projection apparatus 1 including a radiation system LA, IL constructed and arranged to supply a projection beam PB of radiation (e.g. UV or EUV radiation, electrons or ions); a first object table (mask table) MT provided with a first object (mask) holder constructed and arranged to hold a mask MA (e.g. a reticle), and connected to a first positioning device PM constructed and arranged to accurately position the mask with respect to a projection system (lens) PL; a second object table (substrate table) W2T provided with a second object (substrate) holder constructed and arranged to hold a substrate W2 (e.g. a resist-coated silicon wafer), and connected to a second positioning device P2W constructed and arranged to accurately position the substrate with respect to the projection system PL; a third object table (substrate table) W3T provided with a third object (substrate) holder constructed and arranged to hold a substrate W3 (e.g. a resist-coated silicon wafer), and connected to a third positioning device P3W constructed and arranged to accurately position the substrate with respect to the projection system PL. The projection system (lens) PL (e.g. a refractive or catadioptric system, a mirror group or an array of field deflectors) is constructed and arranged to image an irradiated portion of the mask MA onto a target portion of the substrate W.

The radiation system comprises a source LA which produces radiation (e.g. an undulator or wiggler provided around the path of an electron beam in a storage ring or synchrotron, a plasma source, an electron or ion beam source, a mercury lamp or a laser). This radiation is caused to traverse various optical components included in illumination system IL so that the resultant beam PB has a desired shape and intensity distribution in its cross-section.

The beam PB subsequently impinges upon the mask MA that is held in a mask holder on a mask table MT. Having been selectively reflected (or transmitted) by the mask MA, the beam PB passes through the lens PL, which focuses the beam PB onto a target portion of the substrate W2, W3. With the aid of the positioning devices P2W, P3W and interferometers IF mounted on a base plate BP, the substrate table W2T, W3T can be moved accurately, e.g. so as to position different target portions in the path of the beam PB. Similarly, the positioning device PM and the interferometers IF can be used to accurately position the mask MA with respect to the path of the beam PB, e.g. after mechanical retrieval of the mask MA from a mask library or during a scanning motion. In the prior art, movement of the object tables MT, W2T is generally realized with the aid of a long-stroke module (coarse positioning) and a short-stroke module (fine positioning), which are not explicitly depicted in FIG. 1. The depicted apparatus can be used in two different modes:

1. In step mode, the mask table MT is kept essentially stationary, and an entire mask image is projected at once (i.e. a single "flash") onto a target portion. The substrate table W2T, is then shifted in the X and/or Y directions so that a different target portion can be irradiated by the beam PB;
2. In scan mode, essentially the same scenario applies, except that a given target portion is not exposed in a single "flash". Instead, the mask table MT is movable in a given direction (the so-called "scan direction", e.g. the Y direction) with a speed v, so that the beam PB is caused to scan over a mask image; concurrently, the substrate table W2T, is simultaneously moved in the same or opposite direction at a speed V=Mv, in which M is the magnification of the lens PL (e.g., M=¼ or ⅕). In this manner, a relatively large target portion can be exposed, without having to compromise on resolution.

In a lithographic projection apparatus according to the present invention, at least one of first and second object tables are provided in a vacuum chamber 20. The vacuum inside the vacuum chamber 20 is created with a vacuum generator, for example a pump.

Figure 2:
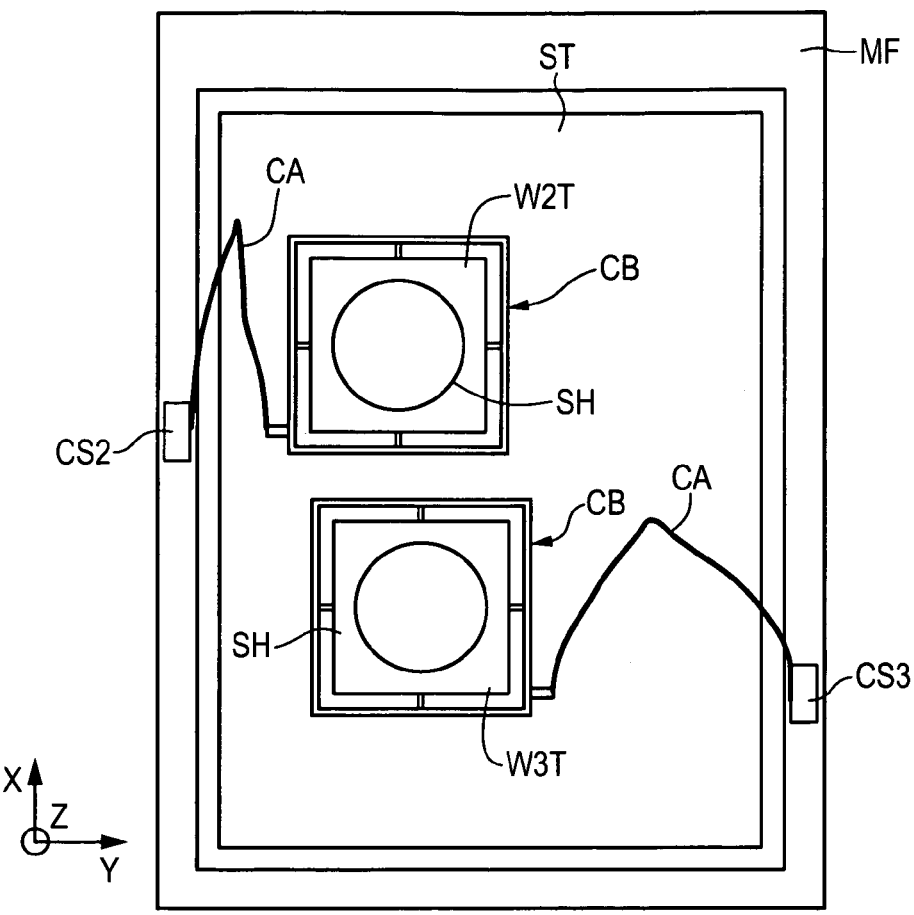
FIG. 2 is a schematic plan showing two substrate tables comprising a bumper according to the first embodiment.

FIG. 2 is a schematic plan showing two substrate tables including a collision bumper according to the first embodiment of the invention. Two substrate tables W2T and W3T are connected with cables CA to cable shuttles CS2 and CS3, respectively. The cable shuttles CS2 and CS3 will follow their respective table in the X-direction by having a detector that detects the position of the table with respect to the cable shuttle and which detector adjusts the position of the cable shuttle if the table moves in the X-direction away from the cable shuttle so that the shuttle follows the substrate table. In the Y-direction, the cables CA will allow for movement of the substrate tables W2T and W3T. The substrate tables W3T and W2T are positioned and levitated with the aid of a planar motor comprising a stator ST having a plurality of magnets in an x-y plane of an orthogonal x-y-z axis system and an electric coil system in a translator provided to the substrate tables W3T, W2T. The substrate tables W2T, W3T may be provided with a short stroke motor for generating short displacements between the translator and the substrate holder SH that in use holds the wafer. The short stroke motor may give a higher precision and a higher response rate for the positioning of the substrate. The magnets of the x-y plane may be arranged in rows and columns according to a Halbach array, i.e. the magnetic orientation of successive magnets in each row and each column rotates 90° counterclockwise. The substrate tables W3T, W2T will be positioned by driving current through the electric coil system of the translators. During a power failure of the planar motor or an error in the programmed control logic of a controller of the apparatus, there is a possibility of a collision in the apparatus 1. First of all the levitation force of the planar motor will be stopped so that the substrate tables W3T and W2T will fall down onto the stator of the planar motor. Secondly, it will not be possible to stop any movement of the substrate table because there is no mechanical braking system in the planar motor. The substrate table has to be stopped by actively driving a current trough the windings in the translator that will not be possible during a power failure so that there is a big chance of a collision between the two substrate tables W3T and W2T or a collision between one of the substrate tables W3T or W2T and a machine frame MF surrounding the planar motor.

Figure 3:
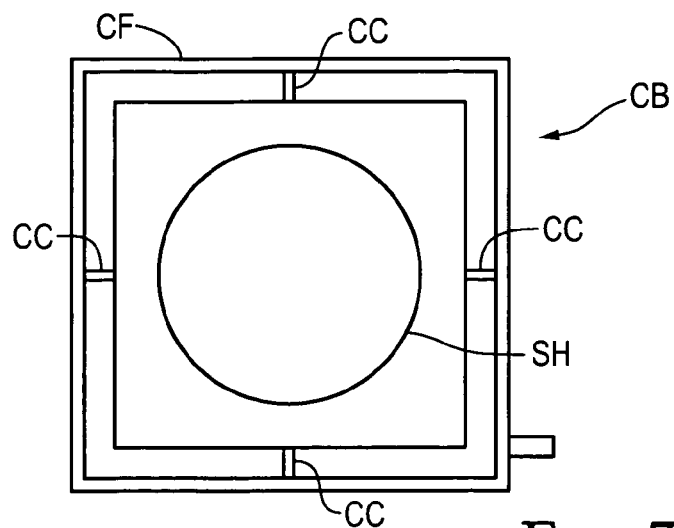
FIG. 3 shows a more detailed view on the bumper of one of the substrate tables of FIG. 2.

FIG. 3 shows a more detailed view on the collision bumper CB of substrate table W3T. The collision bumper CB is provided with a collision frame CF having the same form as the substrate table W3T and being a little larger. The collision bumper CB further comprises a connecting part CC with the substrate table W3T which may absorb a lot of the energy of a collision. The collision bumper may include a memory alloy, such as a nickel-titanium alloy, having a relatively high damping coefficient without being totally deformed.

Figure 6:
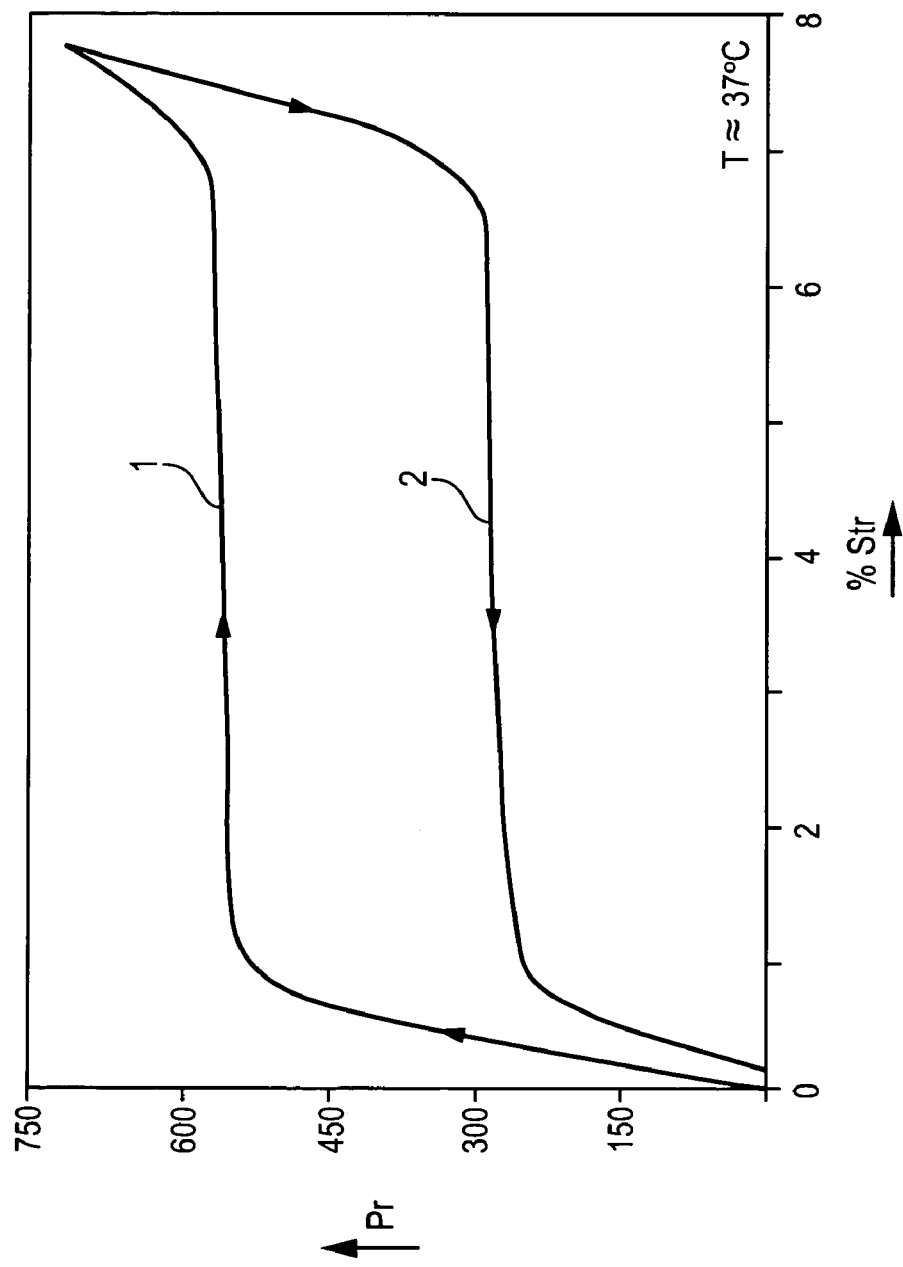
FIG. 6 is a diagram showing the collision absorbing properties of a nickel titanium alloy.

FIG. 6 shows the energy absorption of nickel titanium while being pressed. The x-axis depicts the percentage of strain (Str) to which the bumper is subjected while the y-axis depicts the amount of energy necessary therefore in N/mm$^2$. What is shown is that the energy necessary to strain the material (curve 1) is much larger than the energy released after release of the material (curve 2). The collision bumper may have a position in Z that is close to the center of mass of the substrate table so that the risk of turn over of the substrate table is decreased.

Figure 4:
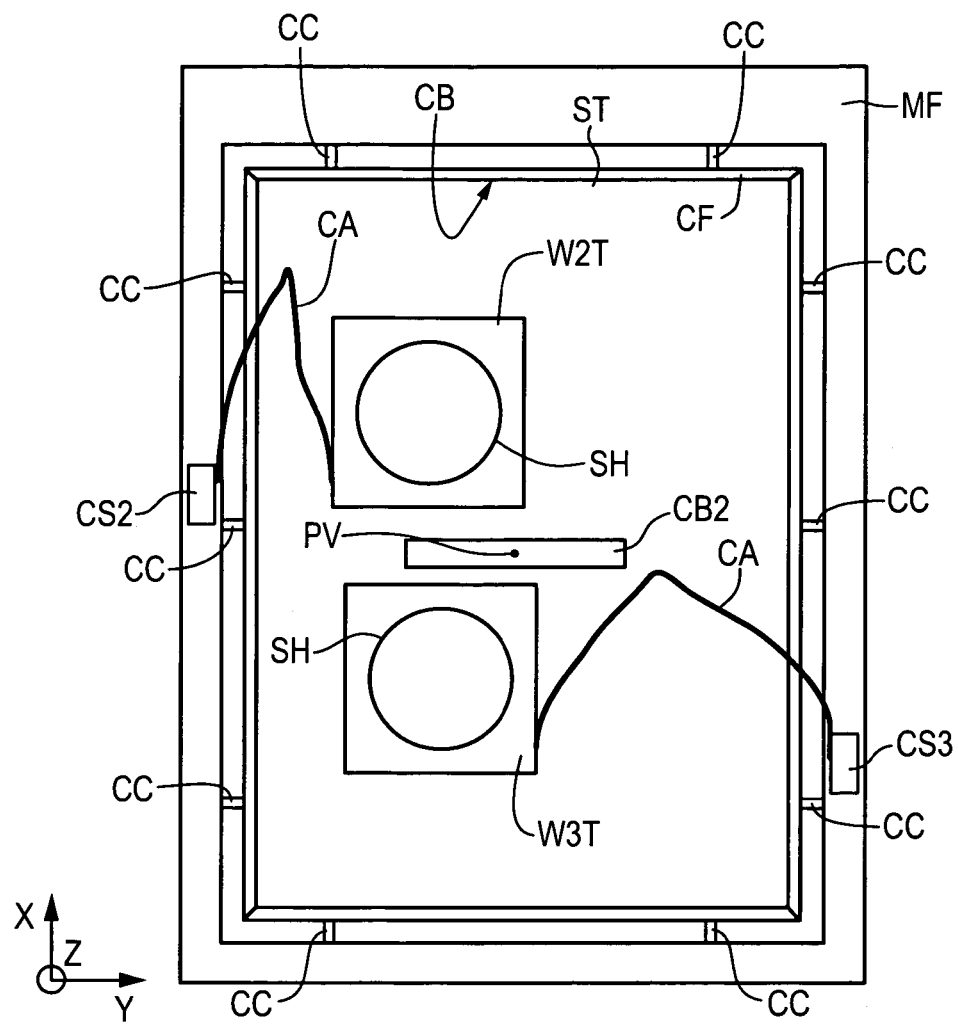
FIG. 4 is a schematic plan showing two substrate tables and a bumper according to a second embodiment of the present invention.

FIG. 4 is a schematic plan showing two substrate tables and a collision bumper according to the second embodiment of the invention. The collision bumper CB includes a collision frame CF and a connecting part CC for connecting the collision frame CF to the machine frame MF. During a power failure the substrate tables W2T and W3T may collide against the collision frame CF which is connected to the machine frame MF via the connecting parts CC. The energy of movement of the substrate table will be absorbed smoothly by the collision frame CF and the connecting parts CC. The collision frame CF and the connecting parts CC may be made from a memory alloy for this purpose. The substrate table may be provided with mirrors on its side faces. It should be avoided that the collision frame CF and the mirrors make contact. The position of the collision frame CF should therefore be lower then the position of the mirrors of the substrate table. To circumvent collisions between the substrate tables W2T and W3T a second collision bumper CB2 is located in the center of the plane of the stator ST. This second collision bumper CB2 can be rotated around the pivot point PV. This will be done when the substrate tables have to exchange positions. In that case both substrate tables W3T and W2T will be moved in the Y-direction to their respective cable shuttle, then the collision bumper CB will be rotated 90° and subsequently both substrate tables will move in the X-direction passing each other. During the exchange both tables are separated by the second collision bumper CB2.

Figure 5:
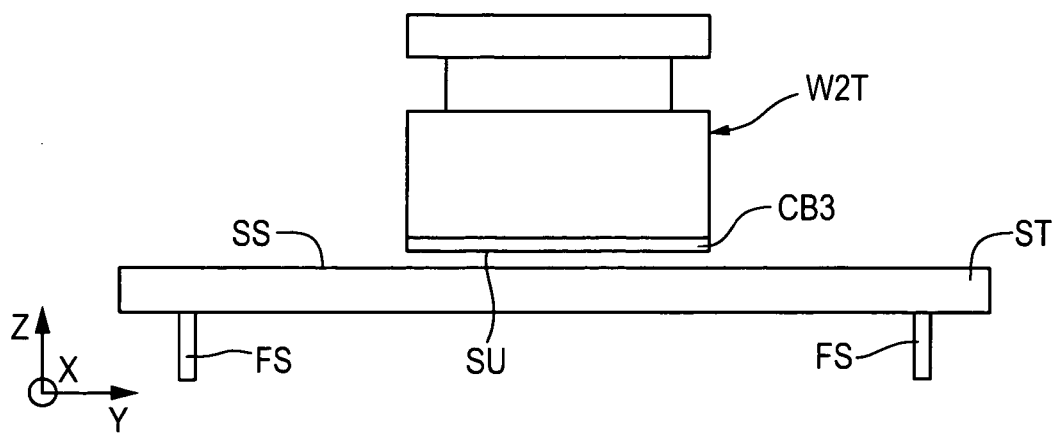
FIG. 5 is a sectional view on a substrate table and a bumper according to a third embodiment of the present invention.

FIG. 5 is a sectional view on a substrate table and a collision bumper according to a third embodiment of the invention. The stator ST is supported by a flexible support FS to minimize any bouncing between the stator ST and the substrate table W2T. The substrate table W2T is for the same reason provided with a collision bumper CB3 underneath the substrate table W2T. This collision bumper may have heath resistant capacity to thermally isolate the coils underneath the substrate table W2T from the stator. The collision bumper CB3 according to this embodiment may alternatively be provided to the stator ST.

The surface SU underneath the substrate table W2T may also be made of a material having a high friction so that any movement of the substrate table W2T in a collision may be decreased by the friction between the surface SU of the substrate table W2T and the surface SS of the stator ST. For the same reason the surface SS of the stator ST may be provided with a material having a high friction coefficient.

Figure 7:
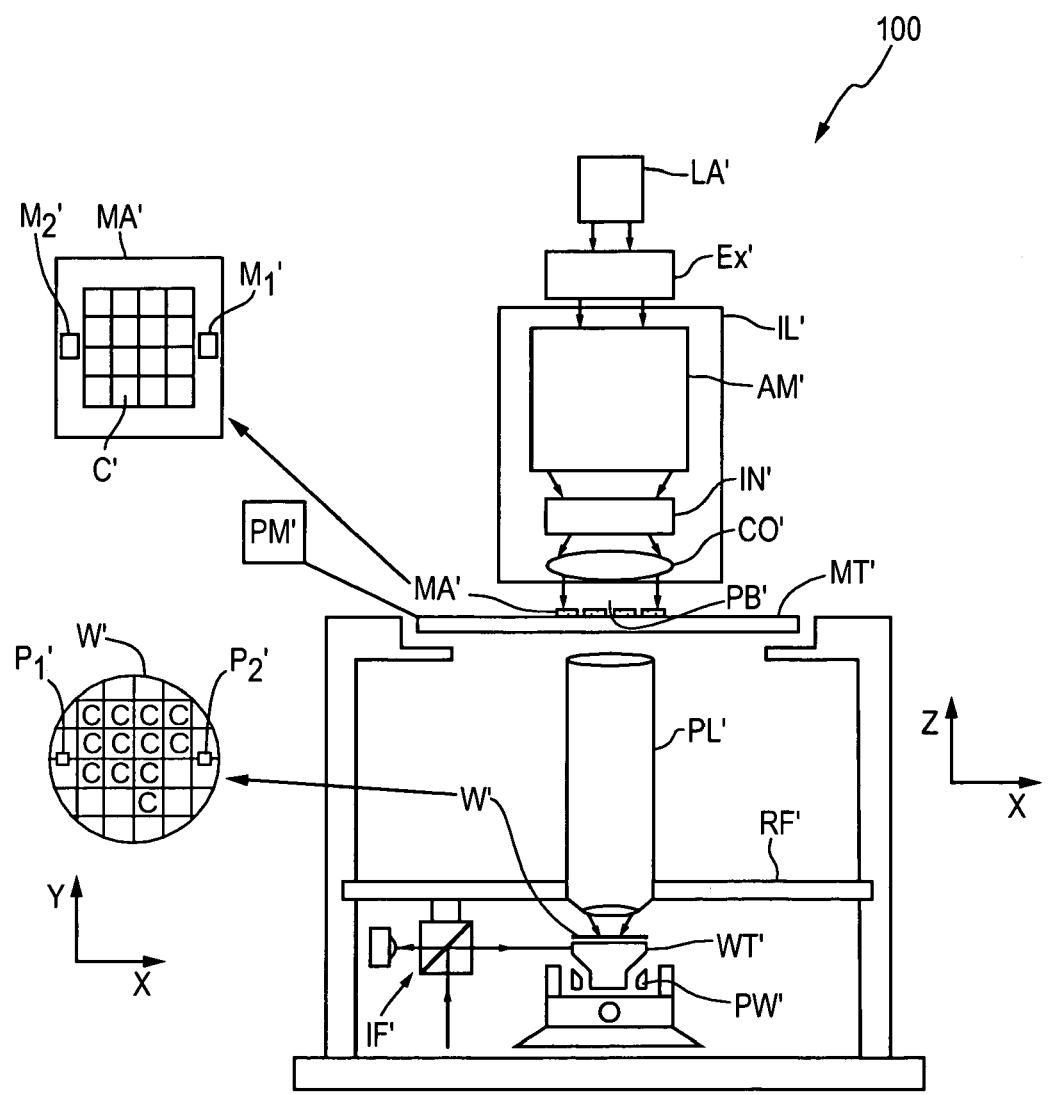
FIG. 7 depicts a lithographic projection apparatus according to a fourth embodiment of the present invention.

FIG. 7 schematically depicts a lithographic projection apparatus 100 according to a fourth embodiment of the invention. Further embodiments of the invention are described with reference to the embodiment shown in FIG. 7.

The apparatus 100 includes a radiation system Ex', IL' constructed and arranged to supply a projection beam PB' of radiation (UV radiation), which in this particular case also comprises a radiation source LA'; a first object table (mask table) MT' provided with a mask holder constructed and arranged to hold a mask MA' (e.g. a reticle), and connected to a first positioning device PM' constructed and arranged to accurately position the mask with respect to a projection system (lens) PL'; a second object table (substrate table) WT' provided with a substrate holder constructed and arranged to hold a substrate W' (e.g. a resist-coated silicon wafer), and connected to a second positioning PW' device constructed and arranged to accurately position the substrate with respect to the projection system PL'. The projection system (lens) PL' (e.g. a refractive lens) is constructed and arranged to image an irradiated portion of the mask MA' onto a target portion C' (e.g. comprising one or more dies) of the substrate W'. As here depicted, the apparatus 100 is of a transmissive type (e.g. has a transmissive mask). However, in general, it may also be of a reflective type, for example (e.g. with a reflective mask). Alternatively, the apparatus 100 may employ another kind of patterning device, such as a programmable mirror array of a type as referred to above.

The source LA' (e.g. an Hg lamp) produces radiation. This radiation is fed into an illumination system (illuminator) IL', either directly or after having traversed a conditioning device, such as a beam expander Ex'. The illuminator IL' may comprise an adjusting device AM' constructed and arranged to set the outer and/or inner radial extent (commonly referred to as σ-outer and σ-inner, respectively) of the intensity distribution in the beam. In addition, it will generally include various other components, such as an integrator LN' and a condenser CO'. In this way, the beam PB' impinging on the mask MA' has a desired uniformity and intensity distribution in its cross-section.

It should be noted with regard to FIG. 7 that, the source LA' may be within the housing of the lithographic projection apparatus 100 (as is often the case when the source LA' is a mercury lamp, for example), but that it may also be remote from the lithographic projection apparatus, the radiation beam which it produces being led into the apparatus (e.g. with the aid of suitable directing mirrors). This latter scenario is often the case when the source LA' is an examiner laser. The present invention encompasses both of these scenarios. The beam PB' subsequently intercepts the mask MA', which is held on a mask table MT'. Having traversed the mask MA', the beam PB' passes through the lens PL', which focuses the beam PB' onto a target portion C' of the substrate W'. With the aid of the second positioning device PW' and interferometers IF', the substrate table WT' can be moved accurately, e.g. so as to position different target portions C' in the path of the beam PB'. Similarly, the first positioning device PM' can be used to accurately position the mask MA' with respect to the path of the beam PB', e.g. after mechanical retrieval of the mask MA' from a mask library, or during a scan. In general, movement of the object tables MT', WT' will be realized with the aid of a long-stroke module (coarse positioning) and a short-stroke module (fine positioning), which are not explicitly depicted in FIG. 7. However, in the case of a wafer stepper (as opposed to a step-and-scan apparatus) the mask table MT' may just be connected to a short stroke actuator, or may be fixed.

The depicted apparatus can be used in two different modes:

1. In step mode, the mask table MT' is kept essentially stationary, and an entire mask image is projected at once (i.e. a single "flash") onto a target portion C'. The substrate table WT' is then shifted in the x and/or y directions so that a different target portion C' can be irradiated by the beam PB';

2. In scan mode, essentially the same scenario applies, except that a given target portion C' is not exposed in a single "flash". Instead, the mask table MT' is movable in a given direction (the so-called "scan direction", e.g. the y direction) with a speed v, so that the projection beam PB' is caused to scan over a mask image; concurrently, the substrate table WT' is simultaneously moved in the same or opposite direction at a speed V=Mv, in which M is the magnification of the lens PL' (typically, M=¼ or ⅕). In this manner, a relatively large target portion C' can be exposed, without having to compromise on resolution.

Figure 8:
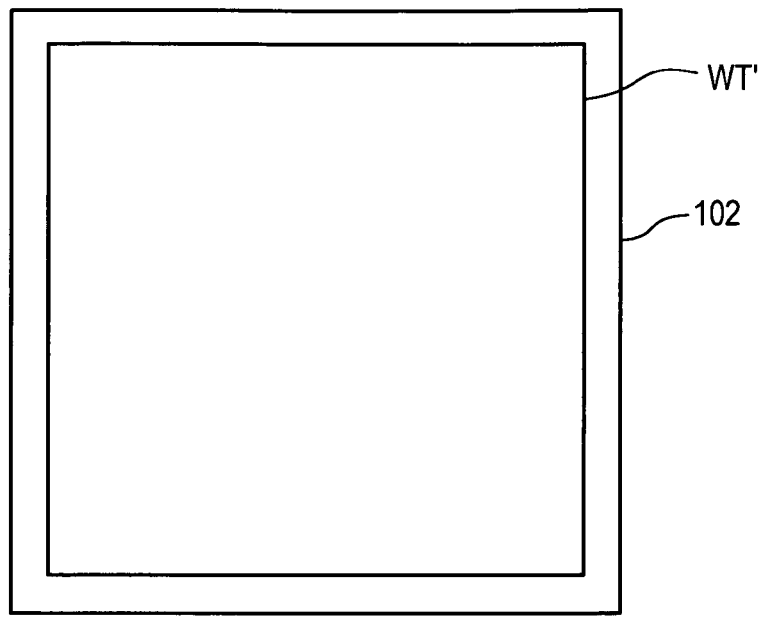
FIG. 8 is a plan view of a rim or crash rim according to the fourth embodiment.
Figure 9:
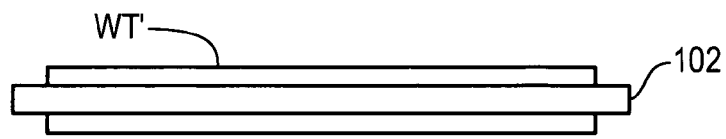
FIG. 9 is a side view of the crash rim according to the fourth embodiment.

With reference to FIG. 7, FIG. 8 is a plan view of the wafer table WT' equipped with a crash protection rim 102. A side view of the crash protection rim 102 and wafer table WT' is shown in FIG. 9. The rim 102 projects out from the edges of the wafer table WT' and is mounted so that it can move relative to the wafer table WT' when an impact occurs. At least one damper connects the rim 102 to the wafer table WT'. In this embodiment the damper is constructed from a super-elastic memory metal. For example, a metal from the family of alloys known as "nitinol" comprising a nearly equal mixture of nickel (55% by weight) and titanium. Other constructions of damper are possible, for example an oil or elastic spring based damper or a damper designed to deform plastically when an impact occurs. When the rim hits an obstacle it moves relative to the wafer table WT'. The damper is compressed and the force of the impact reaching the wafer table WT' is reduced. In this embodiment the use of a super elastic memory metal enables the damper to be reduced in size and weight over the alternatives.

Figure 10:
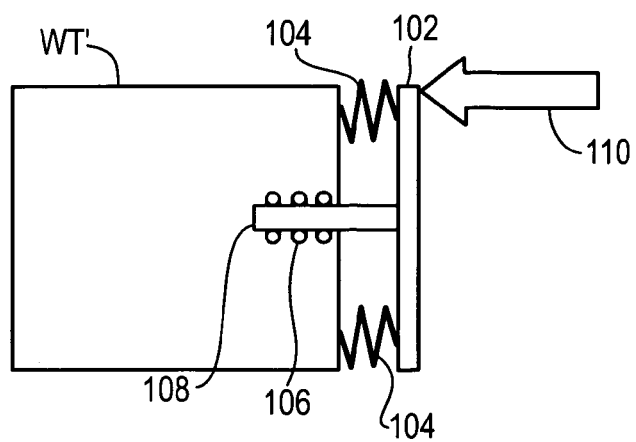
FIG. 10 is a plan view of an off-center impact on the crash rim according to the fourth embodiment.

FIG. 10 illustrates the arrangements of dampers 104 on one side of the crash protection rim 102. Two dampers 104 are mounted at two corners of the wafer table WT', connecting the wafer table WT' and the rim 102. A rod 108 is attached to the crash protection rim 102 and is constrained to move in a single direction by a linear bearing 106. In this way an off-center impact, such as that illustrated by the arrow 110, is spread evenly between the two dampers 104. If the rod 108 and bearing 106 were not present an off-center impact would be focused on one of the dampers 104 and not spread evenly. (The rim 102 would tend to rotate as well as moving in the direction of the force.) The crash stroke for an off-center impact would then be larger than a central impact, which presents problems with design. The physical design of the dampers must consider the likely kinetic energy and forces involved in an impact, the maximum force which can be transferred to the wafer table WT' without causing damage, and the maximum allowable crash stroke. It is desirable for the crash stroke to be as small as possible, reducing the distance that the rim 102 must project out of the wafer table WT' and allowing a smaller, lighter construction. The crash rim 102 also incorporates a positioning mechanism to ensure that it remains in the correct position during normal operation and returns to the correct position after a collision. The position of the crash rim 102 relative to the table may be monitored by a crash detection sensor. Should a collision occur, such a crash detection sensor detects that the rim has moved and stops the manufacturing process. Although FIG. 10 only illustrates a rim 102 provided on one side of the wafer table WT' the construction can be applied to the other sides if required. Furthermore, although the construction of a crash rim for a wafer table WT' has been described, it could equally be applied to a mask table MT'.

Figure 11:
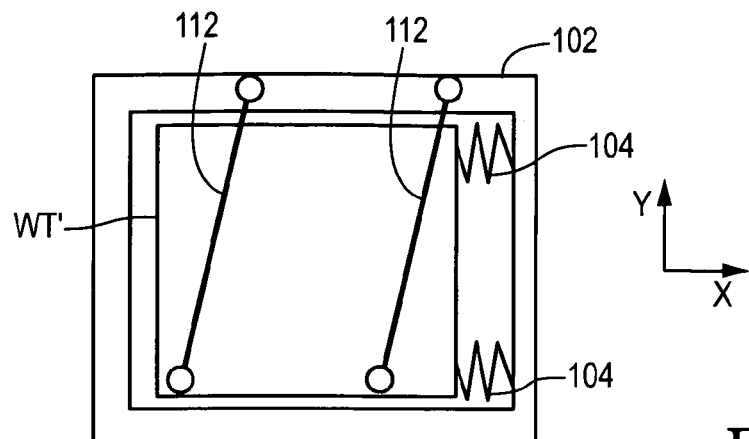
FIG. 11 is a plan view of the arrangement of dampers according to a fifthembodiment of the present invention.

FIG. 11 illustrates an alternative construction of the crash rim of the fourth embodiment. The construction is as described for the fourth embodiment save for the differences set out below.

In this embodiment the crash rim 102 extends around all sides of the wafer table WT' as a single piece construction. Two dampers 104 are connected between the side of the rim 102 furthest from the wafer table WT' in the X direction and the side of the wafer table WT' directly opposite. A pair of connecting members 112, for example pre-tensioned springs, connect the side of the crash rim 102 furthest from the wafer table WT; in the Y direction with the side of the wafer table furthest from that side of the crash rim 102 via pin joints. The connecting members 112 form a parallelogram configuration, being connected in a position further in the +X direction on the crash rim 102 than on the wafer table WT'.

This construction allows the mechanism to spread the force of off-center impacts in the X direction between the dampers 104. In the Y direction the connecting members 112 themselves function as the dampers. However, in the Y direction there is no mechanism to spread the force of an off-center impact between the two connecting members 112. The construction of the crash rim in this embodiment uses knowledge of the obstacles likely to be faced by a wafer table WT' when moving in a multi stage device. The pretensioned dampers 104 only shorten when the force applied to the dampers 104 is larger than the pretension. During a collision in the X direction, the pretension will never be exceeded, whereas during a collision in the Y direction that is what will happen exactly.

Figure 12:
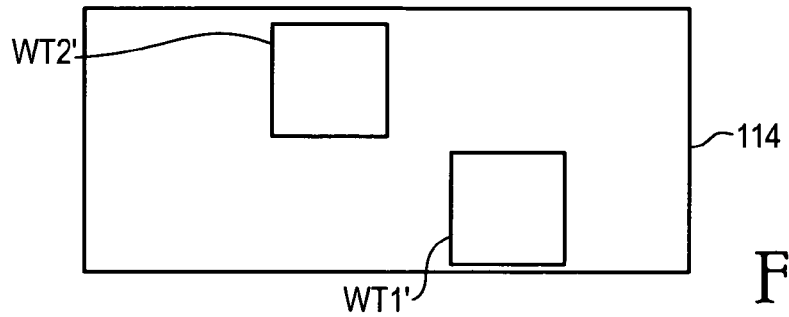
FIG. 12 is a plan view of the relative positions of two wafer tables in a multi-stage apparatus, according to the fifth embodiment.

FIG. 12 illustrates two wafer tables WT1', WT2' moving in a multistage device. The area of movement is defined by a rectangular wall 114. The wafer table WT1' can collide with the wall 114 or the other wafer table WT2'. In the +X and −X directions any off-center impact is spread evenly between the dampers 104 by the parallelogram assembly of the connecting members 112. In the −Y direction the wafer table WT1' can only hit the wall. Any impact in this direction will therefore be spread evenly across the crash protection rim on that side. In the +Y direction the wafer table WT1' can hit the other wafer table WT2' However, the small space between the two wafer tables in this situation leads to a low crash velocity. It is therefore possible to absorb the force without providing a compensating mechanism. (A typical crash stoke in the +Y direction would be 3 mm.)

In this embodiment only two dampers and two pretensioned springs are required This allows the overall construction to be light and inexpensive with only a small compromise in performance. The construction of this embodiment can easily be adapted to provide crash protection for a mask table.

Figure 13:
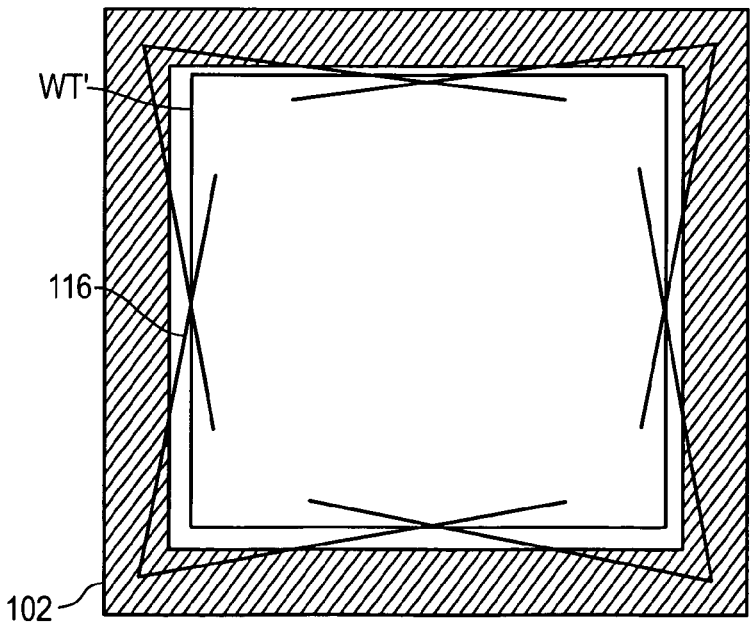
FIG. 13 is a plan view of the arrangement of dampers according to a sixth embodiment of the present invention.

FIG. 13 is a plan view of the construction of a crash protection rim according to a sixth embodiment of the present invention. The construction is the same as for the fourth embodiment, save as described below.

A single piece crash protection rim 102 is connected to the wafer table WT' by eight dampers 116. As with the fourth embodiment, the dampers 116 are constructed from a superelastic memory metal, but alternatives such as oil or elastic spring dampers may also be used. Each corner of the crash protection rim has two dampers attached to a common point. The dampers 116 from each corner of the rim 102 are connected in a triangular layout to positions on the wafer table WT'.

The dampers 116 will buckle under a compressive load, they are only active when subjected to a tensile load. Therefore, two dampers will be active when a collision with one side of the crash protection rim occurs. In operation, the dampers 116 operate in a similar manner to pretensioned springs and only deform when the crash force is higher then the pretensioned force. The wires perpendicular to the crash direction will not deform because the load is not higher than the pretensioned force. This ensures the force is evenly distributed between the active dampers in a similar manner to the above mentioned fifth embodiment.

The pretension force in the x and y directions does not have to be equal. Both the ration of the likely collision force in the x direction to the likely collision force in the y direction and the x:y ratio of the rim dimension can be used to optimize the ratio of the x:y pretensioned force.

The construction of the embodiment can easily be adapted for a mask table. Although a triangular layout of dampers has been described a rectangular arrangement can also be used.

The invention is described above in relation to preferred embodiments; however it will be appreciated that the invention is not limited by the above description. In particular, the invention has been described above in relation to the wafer stage of a lithographic apparatus that is accommodated in a vacuum chamber. However, it will readily be appreciated that the present invention is equally applicable to mask tables. The present invention may also be applied outside a vacuum chamber.

What is claimed is:

1. A lithographic projection apparatus, comprising:
   a radiation system constructed and arranged to provide a beam of radiation;
   a first object table constructed and arranged to support a patterning device, the patterning device constructed and arranged to pattern the beam of radiation according to a desired pattern;
   a second object table constructed and arranged to hold a substrate;
   a projection system constructed and arranged to project the patterned beam of radiation onto a target portion of the substrate;
   a collision protection apparatus constructed and arranged to protect at least one of the object tables, or other internal parts of the projection apparatus, against damage during a collision, wherein the collision protection apparatus comprises a rim that is provided on the at least one object table, the rim projecting beyond at least one edge of the at least one object table and being connected to the at least one object table by at least one damper for relative movement thereto.

2. An apparatus according to claim 1, wherein the collision protection apparatus comprises a bumper for absorbing energy of a collision of at least one of the object tables.

3. An apparatus according to claim 2, wherein the bumper comprises a super-elastic or memory alloy to absorb any of the collision energy.

4. An apparatus according to claim 3, wherein the alloy is a nickel titanium alloy.

5. An apparatus according to claim 2, wherein the bumper is provided to at least one of the object tables.

6. An apparatus according to claim 5, wherein the bumper has the form of the outer boundary of the at least one object table.

7. An apparatus according to claim 6, wherein the bumper extends to a larger area than the at least one object table.

8. A lithographic projection apparatus according to claim 1, wherein the at least one object table can be positioned by a planar motor and at least a part of the collision protection apparatus can be positioned between a static and a moving part of the planar motor.

9. An apparatus according to claim 1, wherein the at least one object table can be positioned by a planar motor and the collision protection apparatus can be positioned along the boundaries of a static part of the planar motor.

10. An apparatus according to claim 1, wherein the collision protection apparatus further comprises:
   a rim that is provided on the at least one object table, the rim projecting beyond the edges of the at least one object table in a plane parallel to a direction of movement of the at least one object table;
   two dampers connecting a first side of the rim to a first side of the at least one object table, and
   two connecting rods connecting a second side of the rim, adjacent to the first side, to the at least one object table, the connecting rods forming two opposite sides of a parallelogram in the plane parallel to the direction of movement.

11. An apparatus according to claim 1, wherein the collision protection apparatus further comprises:
   a rim that is provided on the at least one object table, the rim projecting beyond the edges of the at least one object table in a plane parallel to a direction of movement of the at least one object table, and a respective first and second damper connecting each side of the rim to the at least one object table.

12. An apparatus according to claim 11, wherein the respective first damper is connected between a first point on the rim and a second point on the at least one object table, and the respective second damper is connected between the first point on the rim and a third point on the at least one object table, wherein the first, second and third points form a triangle in the plane horizontal to the direction of movement.

13. An apparatus according to claim 1, wherein the rim contains a super-elastic or memory alloy.

14. An apparatus according to claim 13, wherein the alloy is a nickel titanium alloy.

15. An apparatus according to claim 1, wherein the at least one damper contains a super-elastic or memory alloy.

16. An apparatus according to claim 15, wherein the alloy is a nickel titanium alloy.

17. A device manufacturing method using a lithographic apparatus, the method comprising:
   projecting a patterned beam of radiation onto a target portion of the layer of radiation-sensitive material at least partially covering a substrate that is supported by a movable object table; and
   limiting the range of movement of the object table by a collision protection apparatus that protects the object table during a collision of the object table, wherein the collision protection apparatus comprises a rim that is provided on the at least one object table, the rim projecting beyond at least one edge of the at least one object table and being connected to the at least one object table by at least one damper for relative movement thereto.

18. A device manufactured in accordance with the method of claim 17.

19. A device manufacturing method according to claim 17, wherein projecting the patterned beam of radiation comprises projecting the patterned beam of radiation through a vacuum chamber.

* * * * *